(12) United States Patent
Chan et al.

(10) Patent No.: US 6,492,877 B1
(45) Date of Patent: Dec. 10, 2002

(54) COUPLING FOR LC-BASED VCO

(75) Inventors: Edwin Chan, San Jose, CA (US); Ming Qu, San Jose, CA (US); Ji Zhao, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/927,289

(22) Filed: Aug. 9, 2001

(51) Int. Cl.$^7$ .................................................. H03B 5/18
(52) U.S. Cl. ............................ 331/46; 331/117; 331/57
(58) Field of Search ................................ 331/117 R, 45, 331/46, 57, 167

(56) References Cited

U.S. PATENT DOCUMENTS

| | | | |
|---|---|---|---|
| 5,357,217 A | * 10/1994 | Marchesi et al. | ............ 327/259 |
| 5,592,126 A | * 1/1997 | Boudewijns et al. | ........ 331/172 |
| 5,789,986 A | * 8/1998 | Drost et al. | .................... 331/17 |
| 6,218,908 B1 | * 4/2001 | Oberhammer | ............... 331/46 |
| 6,317,008 B1 | * 11/2001 | Gabara | .................... 331/113 R |
| 6,323,737 B1 | * 11/2001 | Broekaert | ................ 331/107 T |
| 6,417,740 B1 | * 7/2002 | Anh et al. | ..................... 331/48 |

OTHER PUBLICATIONS

Ting–Ping Liu, "A 6.5GHz Monolithic CMOS VoltageControlled Oscillator", IEEE International Solid–State Circuits Conference, ISSCC99/Session 23 /Paper WP 23.7, pp. 404–405.

Jafar Savoj, et al., "A 10Gb/s CMOS Clock and Data Recovery Circuit with Frequency Detection", 2001 IEEE International Solid–State Circuits Conference, ISSCC 2001/ Session 5/Gigabit Optical Communications I/5.3, pp. 78–79.

* cited by examiner

Primary Examiner—Tuan T. Lam
Assistant Examiner—Cassandra Cox

(57) ABSTRACT

A two-stage coupling loop system that provides in-phase and quadrature signals in two stages. Each stage includes a signal coupler, an LC-based voltage controlled oscillator (VCO) and in-loop signal buffer that provides an additional controllable phase shift. Inclusion of the buffers in the loop decreases the capacitance load of each VCO.

26 Claims, 4 Drawing Sheets

US 6,492,877 B1

COUPLING FOR LC-BASED VCO

FIELD OF THE INVENTION

This invention relates to control of phase shift for a voltage controlled oscillator.

BACKGROUND OF THE INVENTION

A conventional approach of an LC-based ring oscillator uses three LC stages, with a phase shift sum for the three stages being 180°, as required to support an oscillation. Use of three stages is necessary with a conventional approach, because any stage provides a phase shift of less than 90°, except at certain extreme or unrealistic choices of parameter values. In the simplest three-stage oscillator, each stage provides 60° of phase shift. This arrangement is not suitable for applications that require in-phase and quadrature clock signals that are spaced 90° apart.

Some workers have attempted to handle this problem by providing two couplers and two identical LC-based voltage controlled oscillators (VCOs) to form a coupling loop. The couplers modulate the phases of the LC tank circuits and force the two clock signals to run in quadrature, with a relative phase shift of 90°. However, this arrangement operates at a frequency that is relatively far from the peak LC tank impedance so that the oscillator is less efficient than desired. This arrangement becomes less attractive as the clock frequency increases, because the couplers increase the capacitive load of the oscillator. This lowers the central frequency and/or reduces the frequency tuning range.

What is needed is a configuration that improves the efficiency of the oscillator and increases the center frequency and/or frequency tuning range.

SUMMARY OF THE INVENTION

The invention meets these needs by incorporating a selected signal buffer in each stage of the coupling loop so that the buffer and an associated VCO maintain 90° phase shift within each stage. The additional phase shift introduced by each buffer, helps move the operating point of the oscillator toward the peak impedance point of the LC tank circuit, thus improving the efficiency of the oscillator. The capacitive loading of each oscillator stage is reduced, because the coupler in each stage is only required to drive a signal buffer, not a combination of buffer and in-path coupler. This provides an increase in center frequency or frequency tuning range.

DESCRIPTION OF BEST MODES OF THE INVENTION

Figure 1:
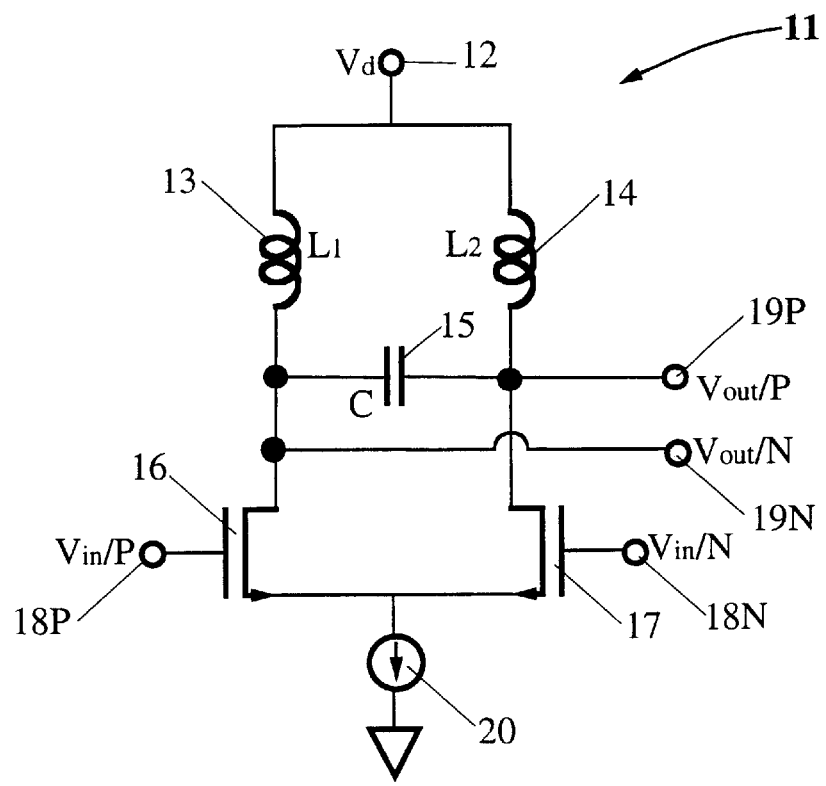
FIG. 1 schematically illustrates an LC-tuned stage of a conventional ring oscillator.
Figure 2:
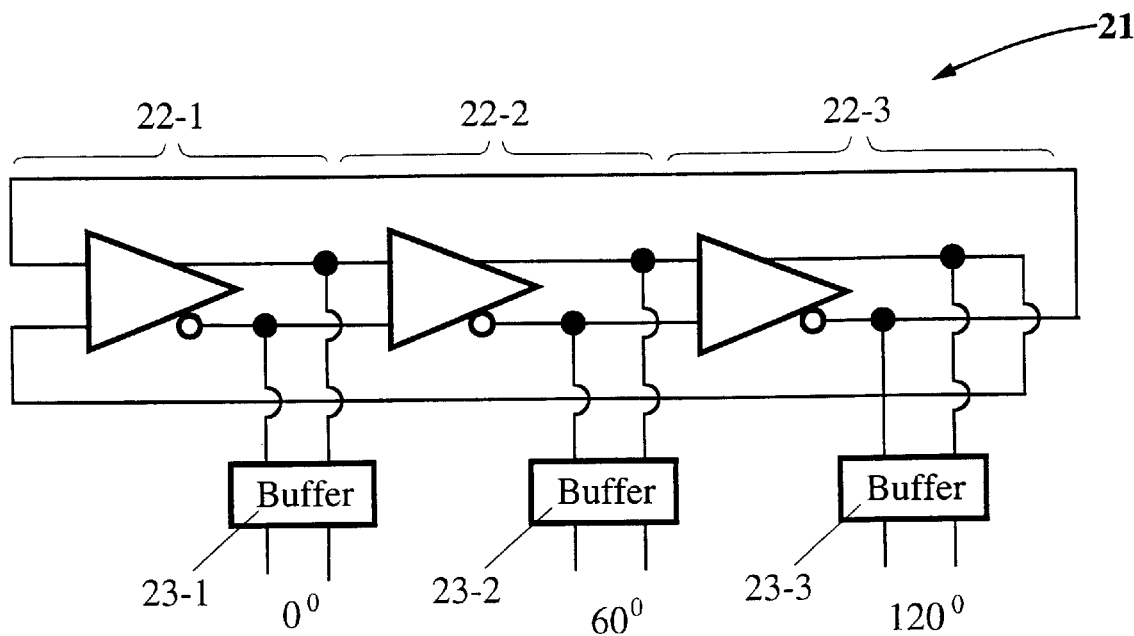
FIG. 2 schematically illustrates a three-stage ring oscillator, according to the prior art, that provides 180° phase shift in the forward signal path.

FIG. 1 schematically illustrates an LC circuit 11 used in each stage of a conventional three-stage ring oscillator, such as the oscillator 21 shown in FIG. 2. The circuit 11 includes two parallel inductors, 13 and 14, each connected at a first end to a selected voltage source 12 ($V_d$), and each connected at a second end to first and second ends of a capacitor 15, respectively. The second ends of the inductors, 13 and 14, are also connected to a current source 20 through respective first and second NMOS transistors, 16 and 17, whose gates are connected to respective first and second polarity signal input terminals, 18P and 18N. The second ends of the inductors, 13 and 14, are connected to respective first and second polarity signal output terminals, 19N and 19P. The circuit 11 has an associated frequency-dependent output impedance given approximately by $$Z(\omega)=(R-j\omega L)/\{(0.5-LC\omega^2)+jRC\omega\}, \qquad (1)$$

where R is a series resistance associated with an inductor. The phase shift graph in FIG. 4 indicates that a phase shift of $\Phi=90°$ is not attainable for any realistic operating frequency. Consequently, at least three stages, 22A, 22B and 22C, each having a phase shift of about 60°, are used in a conventional approach, as illustrated in FIG. 2, to provide a total phase shift of 180° in the forward signal path. Each stage 22-j (j=1, 2, 3) has first and second input signal terminals and has an associated buffer 23-j that receives input signals from two output signal terminals of the stage 22-j. The three pairs of these output signals have associated phase shifts of 0°, 60°, and 120°, respectively.

The output signals from the stage 22-j' (j'=1, 2) are received by corresponding input signal terminals for the stage 22-(j'+1), and the output signals from the stage 22-3 are received with reversed polarities at the input signal terminals of the first stage 22-1, in an oscillator configuration that is familiar to those of skill in this technical area.

Figure 3:
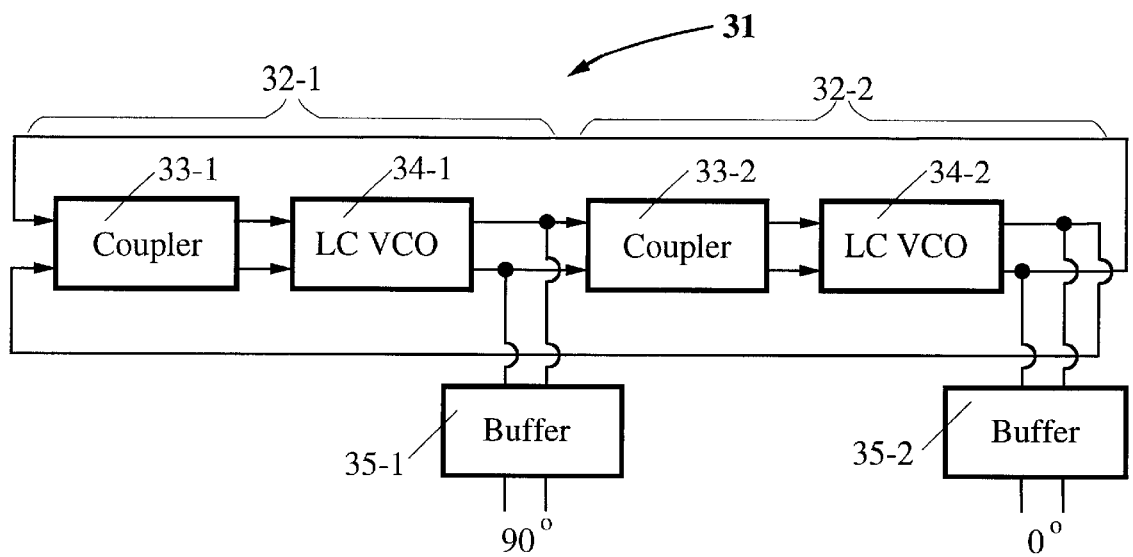
FIG. 3 schematically illustrates a coupling loop including two LC-based VCO stages.

FIG. 3 schematically illustrates a coupling loop 31, constructed according to an alternative approach, that provides a phase shift of 90° for each of two stages 32-k (k=1, 2). Each stage 32-k includes a signal coupler 33-k, an LC-tuned VCO 34-k, and a buffer 35-k that is not in the coupling loop 31. The coupler 33-2 and the buffer 35-1 each receive input signals at two input terminals from two corresponding output terminals of the LC VCO 34-1. The coupler 33-1 receives crossed or reversed polarity input signals and the buffer 35-2 receives non-crossed input signals from two output terminals of the LC VCO 34-2. The LC VCO 34-k receives input signals from two corresponding output terminals of the coupler 33-k k. Output signals from the LC VCO 34-k (k=1, 2) must drive a coupler and must drive a buffer. The FIG. 3 configuration, in which the buffers 35-k are not in the coupling loop 31 is referred to herein as a "buffer-out-of-loop" configuration.

Figure 4A:
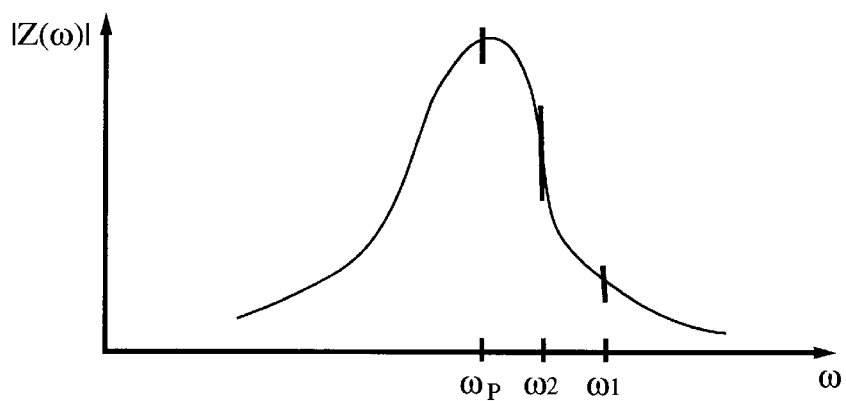
FIGS. 4A and 4B graphically illustrate impedance magnitude and impedance phase shift associated with an LC tank circuit as used in the coupling loops of FIGS. 3 and 5.
Figure 4B:
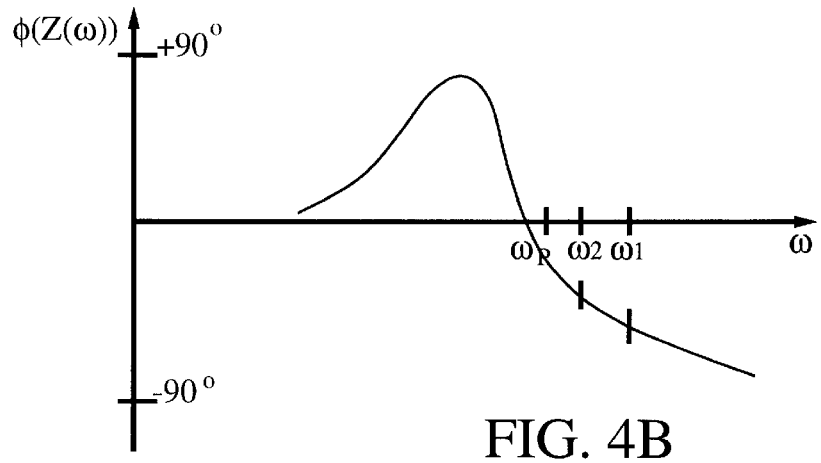

FIGS. 4A and 4B graphically illustrate the magnitude $|Z(\omega)|$ and the phase $\phi(Z(\omega 1))$ for LC tank impedance associated with the LC VCO, 34-1 or 34-2, in the configuration of FIG. 3 and indicate a magnitude $|Z(\omega 1)|$ and a corresponding phase $\phi(Z(\omega 1))$ at which oscillation occurs at an operating frequency $\omega 1$. The impedance magnitude $|Z(\omega 1)|$ is spaced apart a substantial distance from the peak value $|Z(\omega p)|$ that is theoretically available for the LC circuit.

Figure 5:
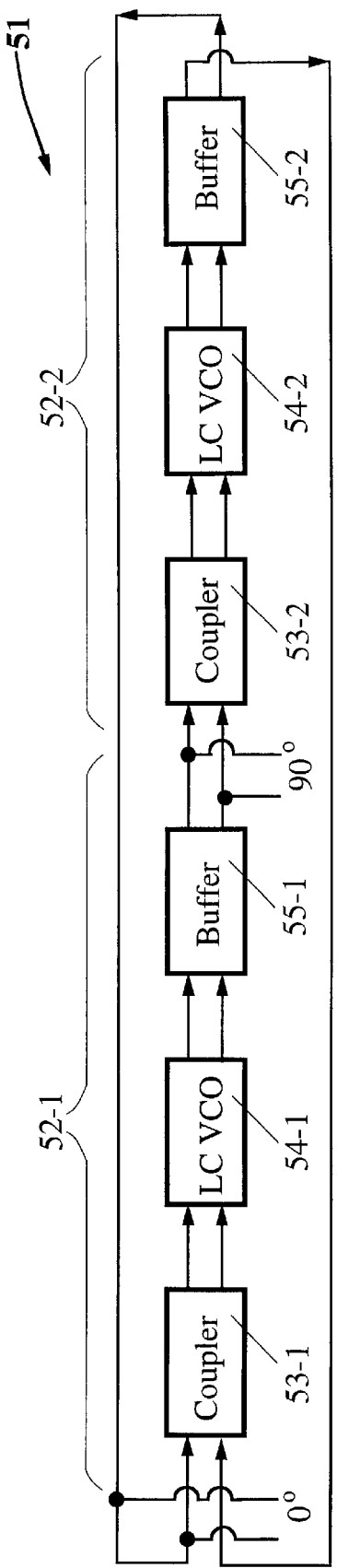
FIGS. 5–9 schematically illustrate an improved coupling loops that include buffers in the coupling loop.

FIG. 5 schematically illustrates an improved coupling loop 51, constructed according to the invention, that provides a phase shift of 90° for each of two stages, 52-k (k=1, 2). Each stage 52-k includes a signal coupler 53-k, an LC-tuned VCO 54-k, and a buffer 55-k that are part of the coupling loop 31. The LC VCO 54-k receives two input signals from the corresponding output signal terminals of the coupler 53-k. The buffer 55-k receives two input signals from the corresponding output signal terminals of the LC VCO 54-k. The coupler 53-2 receives two input signals, having an associated phase shift of 90°, from the corresponding output signal terminals of the buffer 55-1. The coupler 53-1 receives crossed or reverse polarity input signals, having an associated phase shift of 0°, from output signal terminals of the coupler buffer 55-2. Each buffer, 55-1 and 55-2, provides an additional, controllable phase shift $\phi(buf)$ in a range $0 \leq \phi(buf) \leq 30°$.

The additional phase shift introduced by each buffer 23-j in FIG. 5 allows movement of the operating frequency ($\omega = \omega2$) for this configuration toward the peak value cop for the LC tank circuit, which improves the efficiency of the oscillator.

FIGS. 4A and 4B also illustrate the magnitude $|Z(\omega)|$ and the phase $\omega(Z(\omega))$ for LC tank impedance associated with the LC VCO, 54-1 or 54-2, in the configuration of FIG. 5 and indicate a magnitude $|Z(\omega2)|$ and a corresponding phase $\omega(Z(\omega2))$ at which oscillation occurs at an operating frequency $\phi2$. The impedance magnitude $|Z(\omega2)|$ for the system 51 of the invention shown in FIG. 5 is spaced apart from the peak value $|Z(\omega p)|$ by a smaller distance than is the impedance magnitude $|Z(\omega1)|$ for the system 31 shown in FIG. 3. That is, $|Z(\omega1)| < |Z(\omega2)| < |Z(\omega p)|$, and the efficiency of the system in FIG. 5 is greater than the efficiency of the system in FIG. 3.

Because each LC VCO 54-k in FIG. 5 directly drives a buffer 55-k, rather than driving a coupler and a non-in-line buffer as in FIG. 3, the driving force required for the LC VCO 54-k in FIG. 5 is less than the corresponding driving force required for the LC VCO 34-k in FIG. 3. This reduces the loading capacitance of the LC-tuned VCO 54-k (FIG. 5) by an estimated 10–50 percent or more, relative to the loading capacitance of the LC-tuned VCO 34-14 k (FIG. 3).

This capacitance reduction provides an increased center frequency and/or an increased frequency tuning range for the coupling loop 51, relative to the coupling loop 31.

Figure 6:
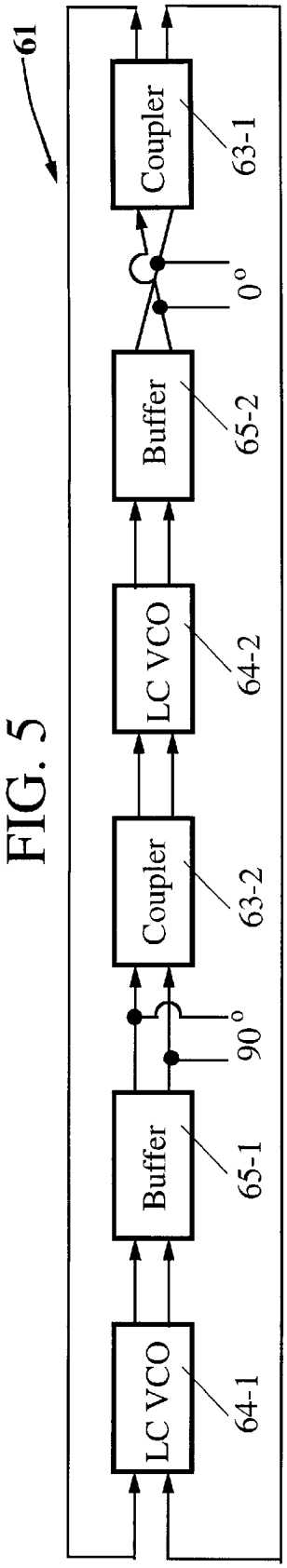
Figure 7:
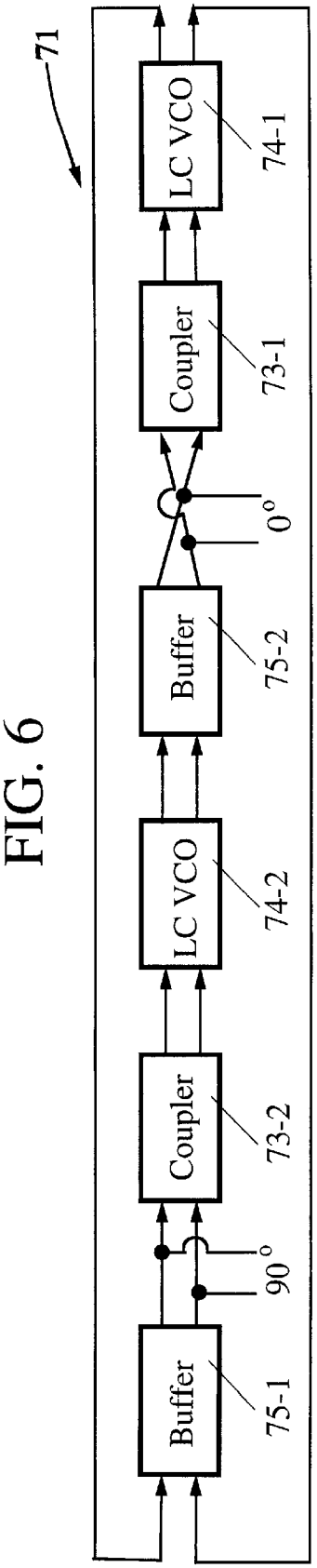
Figure 8:
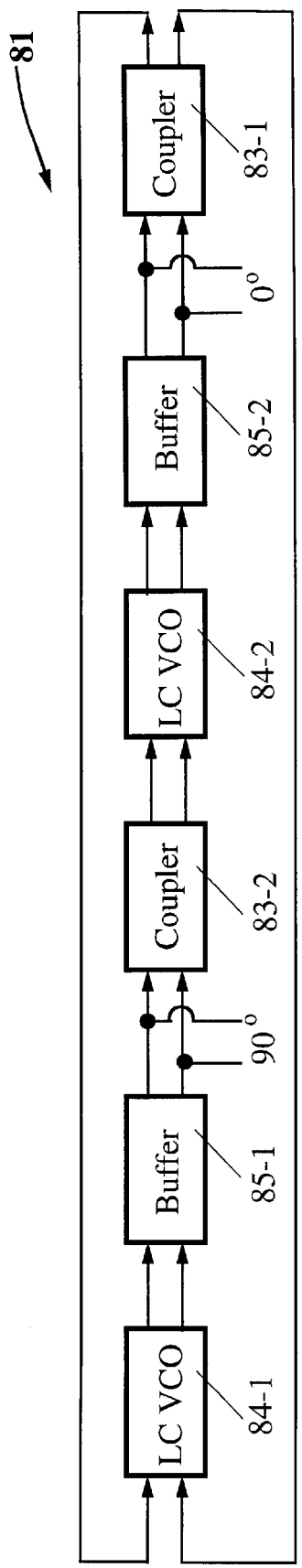
Figure 9:
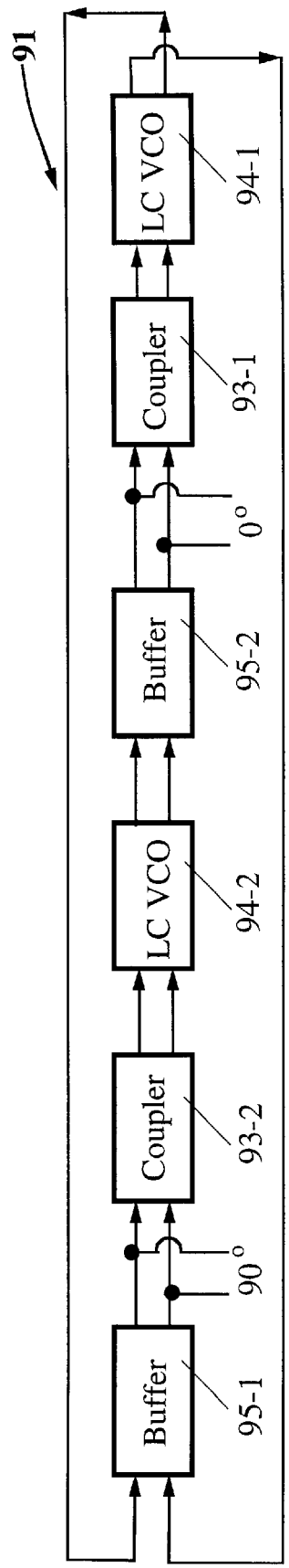

Because of the ring configuration 51 used in FIG. 5, only the order of the components is important in providing an oscillator output signal. For example, the ring configurations 61 and 71 shown in FIGS. 6 and 7 will provide a similar oscillator output signal. Further, the point in the ring at which polarity is reversed can also be changed. In FIG. 8, the polarity is reversed between the first coupler 83-1 and the first LC VCO 84-1. In FIG. 9, the polarity is reversed between the first LC VCO 94-1 and the first buffer 95-1. Polarity may be reversed (once) at other locations in the ring configurations as well in FIGS. 5–9. More generally, polarity may be reversed at 1, 3 or 5 different locations within any of the ring configurations in FIGS. 5–9.

What is claimed is:

1. A coupling loop system comprising:
   first and second couplers, first and second LC-based voltage controlled oscillators (VCOs), and first and second buffers, each comprising two input terminals and two output terminals, where the output terminals of the first and second couplers are connected to the input terminals of the first and second VCOs, respectively, the output terminals of the first and second VCOs are connected to the input terminals of the first and second buffers, respectively, the output terminals of the first buffer are connected to the input terminals of the second coupler, and the output terminals of the second buffer are connected with reversed polarity to the input terminals of the first couplers; and
   wherein the first coupler, first VCO and first buffer are configured to provide a first signal having a first selected phase shift and the second coupler, second VCO and second buffer are configured to provide a second signal having a second selected phase shift at a selected frequency of oscillation.

2. The system of claim 1, wherein at least one of said first and second phase shifts is selected to be 90°.

3. The system of claim 1, wherein each of said first and second phase shifts is selected to be 90°.

4. The system of claim 1, wherein said first buffer is configured to have a first additional phase shift $\phi(buf; 1)$ in a range $0 \leq \phi(buf; 1) \leq 30°$.

5. The system of claim 1, wherein said second buffer is configured to have a second additional phase shift $\phi(buf; 2)$ in a range $0 \leq \phi(buf; 2) \leq 30°$.

6. The system of claim 1, wherein at least one of said first buffer and said second buffer is part of a coupling loop comprising said first and second couplers and said first and second VCOs.

7. The system of claim 1, wherein each of said first buffer and said second buffer is part of a coupling loop comprising said first and second couplers and said first and second VCOs.

8. The system of claim 1, wherein said first VCO has a loading capacitance that is reduced by a fraction in the range of 10–50 percent relative to loading capacitance of a buffer-out-of-loop coupling system in which said output terminals of said first and second couplers are connected to said input terminals of said first and second VCOs, said output terminals of said first VCO are connected to said input terminals of said first buffer and to said input terminals of said second coupler, and said output terminals of said second VCO are connected to said input terminals of said second buffer, and are connected with reversed polarity to said input terminals of said first coupler.

9. The system of claim 1, wherein said second VCO has a loading capacitance that is reduced by a fraction in the range of 10–50 percent relative to loading capacitance of a buffer-out-of-loop coupling system in which said output terminals of said first and second VCOs are connected to said input terminals of said first and second couplers and to said input terminals of said first and second buffers, said output terminals of said first coupler are connected to said input terminals of said second VCO, and said output terminals of said second coupler are connected with reversed polarity to said input terminals of said first VCO.

10. A coupling loop system comprising:
    first and second couplers, first and second LC-based voltage controlled oscillators (VCOs), and first and second buffers, each comprising two input terminals and two output terminals, where the output terminals of the first coupler are connected to the input terminals of the first VCO, the output terminals of the second coupler are connected with reversed polarity to the input terminals of the second VCO, the output terminals of the first and second VCOs are connected to the input terminals of the first and second buffers, respectively, and the output terminals of the first and second buffers are connected to the input terminals of the second and first couplers, respectively; and
    wherein the first coupler, first VCO and first buffer are configured to provide a first signal having a first selected phase shift and the second coupler, second VCO and second buffer are configured to provide a second signal having a second selected phase shift at a selected frequency of oscillation.

11. The system of claim 10, wherein at least one of said first and second phase shifts is selected to be 90°.

12. The system of claim 10, wherein each of said first and second phase shifts is selected to be 90°.

13. The system of claim 10, wherein said first buffer is configured to have a first additional phase shift φ(buf; 1) in a range 0≦φ(buf; 1)≦30°.

14. The system of claim 10, wherein said second buffer is configured to have a second additional phase shift φ(buf; 2) in a range 0≦φ(buf; 2)≦30°.

15. The system of claim 10, wherein at least one of said first buffer and said second buffer is part of a coupling loop comprising said first and second couplers and said first and second VCOs.

16. The system of claim 10, wherein each of said first buffer and said second buffer is part of a coupling loop comprising said first and second couplers and said first and second VCOs.

17. The system of claim 10, wherein said first VCO h as a loading capacitance that is reduced by a fraction in the range of 10–50 percent relative to loading capacitance of a buffer-out-of-path coupling system in which said output terminals of said first and second couplers are connected to said input terminals of said first and second VCOs, said output terminals of said first VCO are connected to said input terminals of said first buffer and to said input terminals of said second coupler, and said output terminals of said second VCO are connected to said input terminals of said second buffer, and are connected with reversed polarity to said input terminals of said first coupler.

18. The system of claim 10, wherein said second VCO has a loading capacitance that is reduced by a fraction in the range of 10–50 percent relative to loading capacitance of a coupling system in which said output terminals of said first and second VCOs are connected to said input terminals of said first and second couplers and to said input terminals of said first and second buffers, said output terminals of said first coupler are connected to said input terminals of said second VCO, and said output terminals of said second coupler are connected with reversed polarity to said input terminals of said first VCO.

19. A coupling loop system comprising:

first and second couplers, first and second LC-based voltage controlled oscillators (VCOs), and first and second buffers, each comprising two input terminals and two output terminals, where the output terminals of the first and second couplers are connected to the input terminals of the first and second VCOs, respectively, the output terminals of the first VCO are connected with reversed polarity to the input terminals of the first buffer, respectively, the output terminals of the second VCO are connected to the input terminals of the second buffer, and the output terminals of the first and second buffers are connected to the input terminals of the second and first couplers, respectively; and wherein the first coupler, first VCO and first buffer are configured to provide a first signal having a first selected phase shift and the second coupler, second VCO and second buffer are configured to provide a second signal having a second selected phase shift at a selected frequency of oscillation.

20. The system of claim 19, wherein at least one of said first and second phase shifts is selected to be 90°.

21. The system of claim 19, wherein each of said first and second phase shifts is selected to be 90°.

22. The system of claim 19, wherein said first buffer is configured to have a first additional phase shift φ(buf; 1) in a range 0≦φ(buf; 1)≦30°.

23. The system of claim 19, wherein said second buffer is configured to have a second additional phase shift φ(buf; 2) in a range 0≦φ(buf; 2)≦30°.

24. The system of claim 19, wherein at least one of said first buffer and said second buffer is part of a coupling loop comprising said first and second couplers and said first and second VCOs.

25. The system of claim 19, wherein each of said first buffer and said second buffer is part of a coupling loop comprising said first and second couplers and said first and second VCOs.

26. The system of claim 19, wherein said first VCO has a loading capacitance that is reduced by a fraction in the range of 10–50 percent relative to loading capacitance of a buffer-out-of-path coupling system.

* * * * *

UNITED STATES PATENT AND TRADEMARK OFFICE
CERTIFICATE OF CORRECTION

PATENT NO. : 6,492,877 B1
APPLICATION NO. : 09/927289
DATED : December 10, 2002
INVENTOR(S) : Chan et al.

It is certified that error appears in the above-identified patent and that said Letters Patent is hereby corrected as shown below:

Column 4, Line 10, "to have a first" should be --to have said first--.
Column 4, Line 13, "to have a second" should be --to have said second--.
Column 5, Line 4, "to have a first" should be --to have said first--.
Column 5, Line 7, "to have a second" should be --to have said second--.
Column 5, Line 13, "wherein each of said" should be --wherein both of said--.
Column 5, Line 17, "first VCO h as" should be --first VCO has--.
Column 6, Line 23, "to have a first" should be --to have said first--.
Column 6, Line 26, "to have a second" should be --to have said second--.

Signed and Sealed this

Thirty-first Day of March, 2009

JOHN DOLL
*Acting Director of the United States Patent and Trademark Office*